United States Patent
Liu et al.

(10) Patent No.: US 7,700,438 B2
(45) Date of Patent: Apr. 20, 2010

(54) MOS DEVICE WITH NANO-CRYSTAL GATE STRUCTURE

(75) Inventors: Chun-Li Liu, Mesa, AZ (US); Tushar P. Merchant, Gilbert, AZ (US); Marius K. Orlowski, Austin, TX (US); Matthew W. Stoker, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 263 days.

(21) Appl. No.: 11/343,624

(22) Filed: Jan. 30, 2006

(65) Prior Publication Data
US 2007/0176227 A1 Aug. 2, 2007

(51) Int. Cl.
*H01L 21/336* (2006.01)
*H01L 21/3205* (2006.01)

(52) U.S. Cl. .............. 438/261; 438/592; 438/593; 257/E21.203; 257/E21.204

(58) Field of Classification Search ................ 257/314, 257/315, 324, E29.129, E21.203, E21.204; 438/257, 261, 591–593, 301
See application file for complete search history.

(56) References Cited

U.S. PATENT DOCUMENTS

| | | | |
|---|---|---|---|
| 6,841,439 B1* | 1/2005 | Anthony et al. | 438/216 |
| 2003/0211680 A1 | 11/2003 | Arghavani et al. | |
| 2004/0106287 A1 | 6/2004 | Chau et al. | |
| 2004/0149686 A1* | 8/2004 | Zhang et al. | 216/37 |
| 2005/0150683 A1* | 7/2005 | Farnworth et al. | 174/255 |
| 2006/0038236 A1* | 2/2006 | Yamamoto | 257/368 |
| 2006/0062937 A1* | 3/2006 | Padiyath et al. | 428/1.33 |
| 2006/0084214 A1* | 4/2006 | Bhattacharyya | 438/197 |
| 2006/0110883 A1* | 5/2006 | Min | 438/260 |
| 2006/0131633 A1* | 6/2006 | Bhattacharyya | 257/314 |
| 2006/0157754 A1* | 7/2006 | Jeon et al. | 257/288 |
| 2006/0180851 A1* | 8/2006 | Lee et al. | 257/315 |
| 2006/0261401 A1* | 11/2006 | Bhattacharyya | 257/316 |
| 2007/0034930 A1* | 2/2007 | Bhattacharyya | 257/314 |
| 2007/0045711 A1* | 3/2007 | Bhattacharyya | 257/315 |
| 2007/0052011 A1* | 3/2007 | Bhattacharyya | 257/324 |

OTHER PUBLICATIONS

DiMaria, D. J., et al., Impact ionization, trap creation, degradation, and breakdown in silicon dioxide films on silicon, J Appl. Phys. 73 (7) Apr. 1, 1993.

* cited by examiner

*Primary Examiner*—Tuan N. Quach
(74) *Attorney, Agent, or Firm*—Ingrassia, Fisher & Lorenz, P.C.

(57) ABSTRACT

Methods and apparatus are provided for non-volatile semiconductor devices. The apparatus comprises a substrate having therein a source region and a drain region separated by a channel region extending to a first surface of the substrate, and a multilayered gate structure containing nano-crystals located above the channel region. The gate structure comprises, a gate dielectric substantially in contact with the channel region, spaced-apart nano-crystals disposed in the gate dielectric, one or more impurity blocking layers overlying the gate dielectric and a gate conductor layer overlying the one more impurity blocking layers. The blocking layer nearest the gate conductor can also be used to adjust the threshold voltage of the device and/or retard dopant out-diffusion from the gate conductor layer.

15 Claims, 7 Drawing Sheets

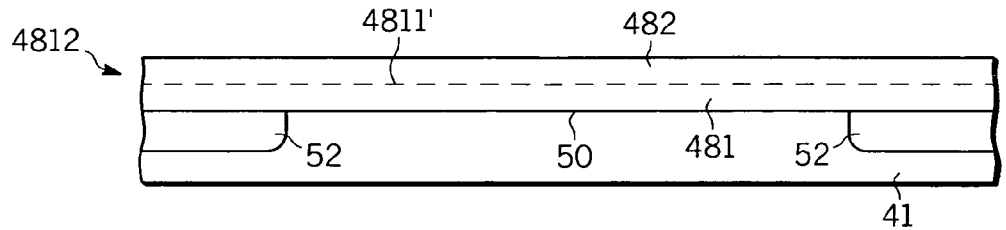
FIG. 15  402-1
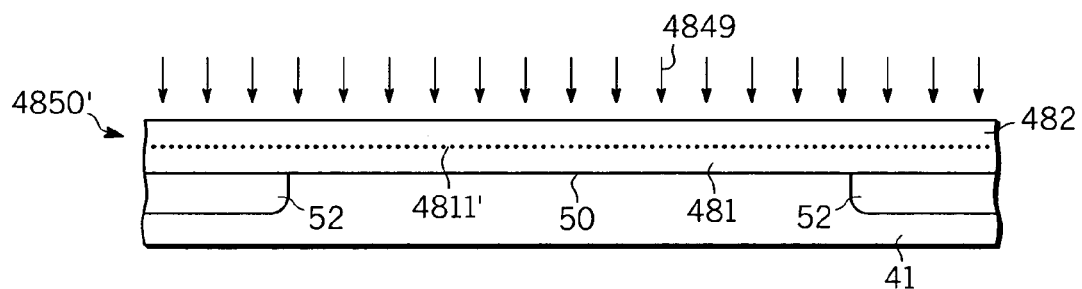
FIG. 16  403-1
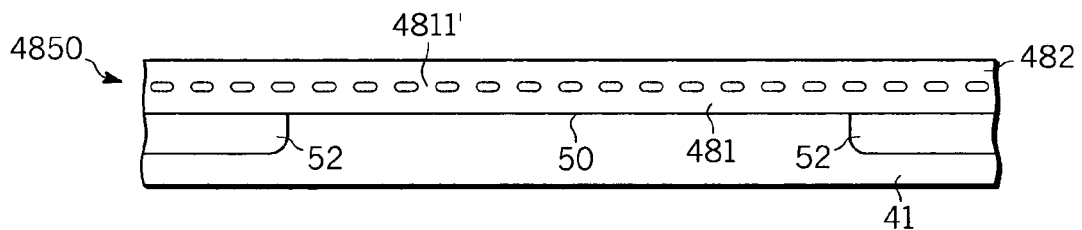
FIG. 17  403-2
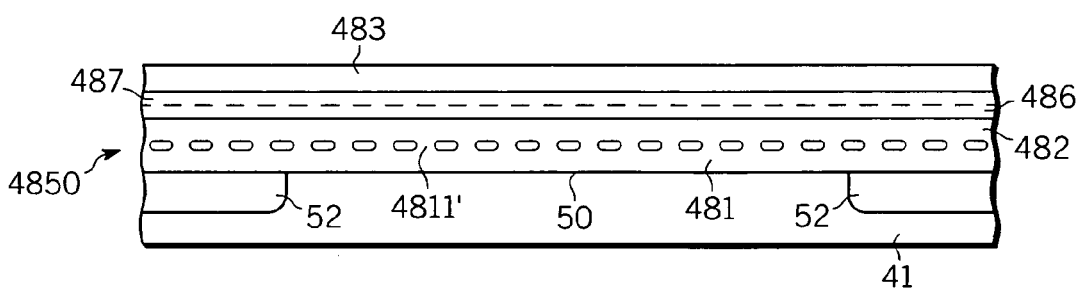
FIG. 18  404-1

MOS DEVICE WITH NANO-CRYSTAL GATE STRUCTURE

TECHNICAL FIELD

The present invention generally relates to transistors and more particularly to transistors with nano-crystal gate structures

BACKGROUND

It is known that semiconductor devices can be constructed that have bi-stable states, that is, whose conductance can be switched between a high and a low state (and vice-versa) by a programming voltage, and that will remain in such high or low state even after the programming voltage is removed. These are used as "non-volatile" memory devices when it is desired to retain information represented by the high or low state even when the power to the device or circuit is turned off. FIG. 1 illustrates prior art MOS device 20 having such capability. Device 20 comprises semiconductor substrate 21 (e.g., of Si) having a first conductivity type, in which are located source region 22 with contact 23 and drain region 24 with contact 25. Source region 22 and drain region 24 are of a second opposite conductivity type. Channel region 27 extends between source region 22 and drain region 24 at surface 30. Above surface 30 between source region 22 and drain region 24 is gate structure 28. Buffer regions 29 laterally separate gate structure 28 from source-drain contacts 23, 25. Buffer regions 29 are also referred to as lateral spacers 29. Field oxide regions 32 conveniently extend from surface 30 into substrate 21 laterally outside source-drain contacts 23, 25. Starting at surface 30 and proceeding upward (i.e., vertically in FIG. 1) gate structure or stack 28 comprises thin gate dielectric layer 281 (e.g., $SiO_2$) on which has been formed nano-crystals 285, then second dielectric layer 282 (e.g., also of $SiO_2$), and then gate conductor layer 283, of for example poly-Si or other conductors. Nano-crystals 285 can be made of Si, SiGe, metals, other conductors and combinations thereof and, as used herein, the term "nano-crystals" is intended to include nano-structures of these and other conductive materials whether crystalline or not. Nano-crystals 285 provide localized electron trap sites. When a sufficiently large programming voltage is applied between substrate 21, source 22, or drain 24 on one side and gate conductor 283 on the other, electron tunneling or other field assisted conduction can occur through thin gate dielectric layer 281 to or from substrate 21 and nano-crystals 285. Thus, charge can be placed on or removed from nano-crystals 285. Charge placed on nano-crystals 285 remains there even when the programming voltage is removed. It is recognized by those skilled in the art that nano-crystals 285 have the function of a floating gate used in conventional non-volatile memory devices. The trapped charge has the effect of providing an effective gate bias that can place device 20 in a conducting or non-conducting state. This state persists even after the programming voltage is removed. Thus, devices of the type illustrated in FIG. 1 can function as non-volatile memory devices. However, such devices suffer from a variety of limitations well known in the art. Non-limiting examples are that: (i) the number of write-erase cycles is more limited than desired, (ii) there can be slow leakage of the charge from nano-crystals 285, and (iii) there can be a gradual drift of the device electrical properties as the device ages.

There is an ongoing need for semiconductor devices that exhibit non-volatile bi-stable or multi-stable behavior but which mitigate or overcome these and other limitations of the prior art. Accordingly, it is desirable to provide an improved device structure and method for non-volatile semiconductor memory devices. In addition, it is desirable that the changes in device structure and method of fabrication used to improve the devices be compatible with or involve little or no change in existing device manufacturing techniques. Furthermore, other desirable features and characteristics of the present invention will become apparent from the subsequent detailed description and the appended claims, taken in conjunction with the accompanying drawings and the foregoing technical field and background.

BRIEF SUMMARY

According to a first exemplary embodiment, there is provided a semiconductor device, comprising, a semiconductor substrate having a principal surface, spaced-apart source and drain regions separated by a channel region at the principal surface, a multilayered gate structure located over the channel region, wherein the multilayered gate structure comprises, a first gate dielectric region, a second gate dielectric region overlying the first gate dielectric region and having an interface with the first gate dielectric region, nano-crystals of a conductive material disposed at the interface between the first and second gate dielectric regions, one or more impurity blocking layers disposed over the second gate dielectric region, and at least a first conductor disposed on the one or more impurity blocking layers.

According to a second exemplary embodiment, there is provided a semiconductor device, comprising, a substrate having therein a source region and a drain region separated by a channel region extending to a first surface of the substrate, a multilayered gate structure located above the channel region, wherein the gate structure comprises, a first dielectric in substantial contact with the channel region, a second dielectric of composition substantially the same or different than the first dielectric disposed on the first gate dielectric, spaced-apart nano-crystals located substantially where the first dielectric and the second dielectric join and covered by the second dielectric, a gate conductor above the second dielectric, wherein the gate conductor is a source of a mobile impurity, and at least one blocking layer disposed between the second dielectric and the gate conductor, and adapted to inhibit motion of the mobile impurity into the second dielectric.

According to a third exemplary embodiment, there is provided a method for forming a semiconductor device with a nano-crystal gate structure resistant to migration of a mobile species, comprising, providing a semiconductor substrate having an upper surface, creating on the upper surface a gate dielectric having therein a layer of spaced-apart nano-crystals of a material adapted to reversibly receive and store charge, forming one or more impurity blocking layers over the gate dielectric, forming a gate conductor layer over the one or more impurity blocking layers, etching out a gate stack comprising portions of the gate dielectric, the nano-crystals, the one or more impurity blocking layers and the gate conductor layer, and providing spaced-apart source-drain regions laterally disposed on either side of the gate stack.

BRIEF DESCRIPTION OF THE DRAWINGS

The present invention will hereinafter be described in conjunction with the following drawing figures, wherein like numerals denote like elements.

FIGS. 15-18 in combination with FIGS. 4-13, show simplified schematic cross-sectional views illustrating sequential steps in methods of fabricating devices of the types illustrated in FIGS. 2-3, according to still further embodiments of the present invention.

DETAILED DESCRIPTION

Figure 1:
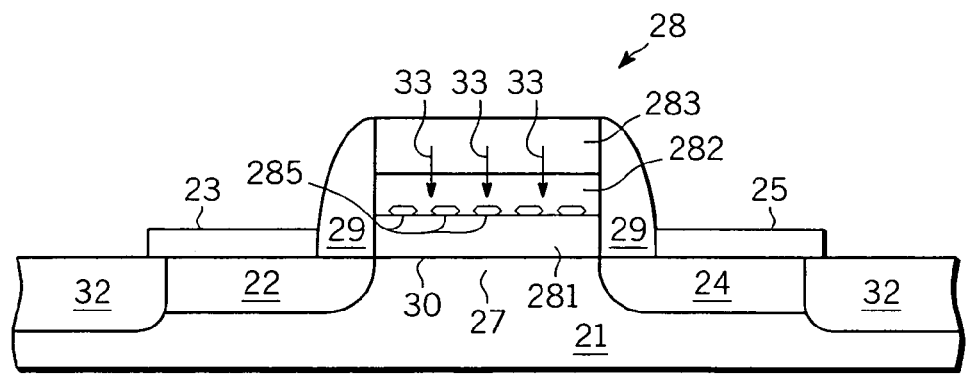
FIG. 1 is a simplified schematic cross-sectional view through a non-volatile memory device, according to the prior art.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner.

MOS devices may be P-channel type devices referred to as PMOS devices or N-channel type devices, referred to as NMOS devices. The teachings herein relate usefully to either PMOS or NMOS devices. Thus, as used herein the terms "P-type" and "N-type" are intended to be equivalent to and include the more general terms "first conductivity type" and "second conductivity type" respectively, where "first" and "second" can refer to either P or N conductivity types. The terms "metal" and "oxide" and metal-oxide semiconductor and the abbreviation "MOS" are intended to include any reasonably stable, conductive and insulating materials, respectively, such as those examples given herein, but not limited thereto.

Referring again briefly to prior art device 20 of FIG. 1, it has been discovered that instabilities observed in connection with such prior art devices are due to migration of impurities within gate stack 28. For example, poly-Si layer 283 tends to contain excess hydrogen, a byproduct of the process for forming poly-Si layer 283. Because the concentration of hydrogen is lower in dielectric layers 282, 281 than in poly-layer 283, hydrogen will diffuse or otherwise migrate into dielectric layers 282 as shown schematically by arrows 33 toward nano-crystals 285 and even into dielectric layer 281. The presence of hydrogen on the surfaces of nano-crystals 285 or in dielectric layers 281 and 282 can change the charge trapping behavior that provides the non-volatile properties of such devices. This migration is enhanced due to defects in the deposited dielectric layer 282, since its quality is generally not as good as a thermally grown dielectric layer. Similarly, dopant atoms provided in poly-layer 283 to adjust its conductivity can also migrate by solid state diffusion into and through dielectric layers 282 and 281, further perturbing the properties of device 20, as for example, by altering the leakage properties of dielectric layers 281, 282.

Figure 2:
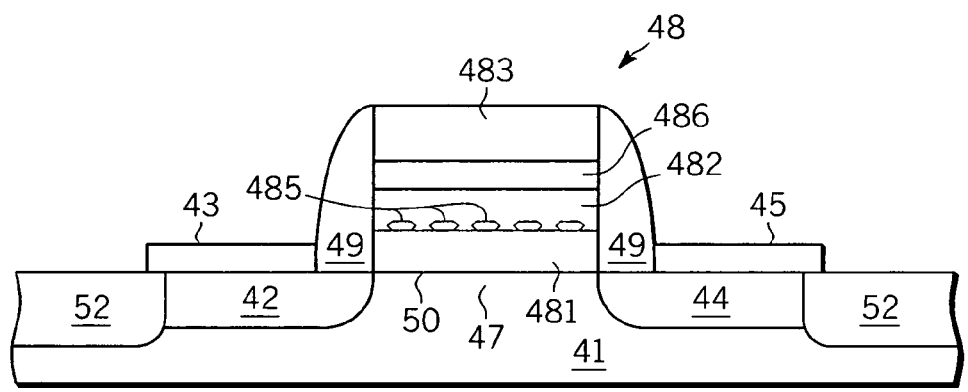
FIG. 2 is a simplified schematic cross-sectional view through a non-volatile memory device, according to an exemplary embodiment of the present invention.

FIG. 2 is a simplified schematic cross-sectional view through non-volatile MOS device 40 with multilayered gate structure 48 according to an embodiment of the present invention. Device 40 comprises semiconductor substrate 41 of a first conductivity type, which in this example is of monocrystalline silicon. However, the terms "semiconductor", "substrate" and "semiconductor substrate" and "polycrystalline semiconductor" as used herein are intended to include any type of semiconductor material and not be limited merely to silicon or to single crystal materials. Non-limiting examples of other useful types of semiconductors are III-V and II-VI compounds that exhibit semiconducting properties, as well as other type IV semiconductor materials. Semiconductor substrate 41 may be polycrystalline or mono-crystalline and may be a bulk semiconductor or a thin film semiconductor or a semiconductor-on-insulating (SOI) substrate. Any and all such arrangements arrangements are useful with the present invention. Mono-crystalline silicon or SOI substrates are preferred.

Source region 42 with contact 43 and drain region 44 with contact 45 are located in substrate 41. Source region 42 and drain region 44 are of a second, opposite, conductivity type to substrate 41. Source region 42 and drain region 44 may be formed by any appropriate technique, such as for example but not limited to ion implantation, thermal doping, molecular beam epitaxy, combinations thereof and other techniques well known in the art. Source region 42 and drain region 44 are separated at surface 50 by channel region 47. Multilayer gate structure 48 overlies channel region 47 and comprises, in this example, first gate dielectric layer 481 (e.g., $SiO_2$), second gate dielectric layer 482 (e.g., $SiO_2$), blocking layer 486 and gate conductor layer 483. Doped polycrystalline silicon (poly-Si) is useful for gate conductor layer 483, but other conductive materials, such as metal silicides (e.g., CoSi, NiSi, etc.) and metals can also be used. Contacts 43, 45 are conveniently of metal, as that term is used herein. Sidewall dielectric spacers 49 are desirably but not essentially provided to laterally separate gate structure 48 from source-drain contacts 43, 45. Field oxide regions 52 of, for example, silicon dioxide, provide isolation laterally outside source-drain regions 42, 44. At the intersection of first gate dielectric layer 481 and second gate dielectric layer 482 are located nano-crystals 485. First gate dielectric layer 481 is conveniently of thermally grown silicon oxide ($SiO_2$), but can be of silicon oxide formed by other techniques or formed of other suitable oxides, such as for example and not intended to be limiting, $HfO_2$ or $ZrO_2$. Metal oxides usually have significantly higher dielectric constants than $SiO_2$. Hence, the thickness of such metal oxides can exceed the physical thickness of $SiO_2$ and still provide a smaller electric equivalent oxide thickness (EOT). When $SiO_2$ is used for first gate dielectric layer 481, it is conveniently formed by thermal oxidation of substrate 41 at temperatures above 700° C., and to a thickness in the range of preferably about 10 to 100 Angstrom units. When metal oxides are used for layer 481, they desirably should have an EOT in about the same range or smaller. Second gate dielectric layer 482 is conveniently also of silicon oxide ($SiO_2$) provided, for example, by deposition. Nano-crystals 485 are conveniently formed by deposition prior to the formation of second gate dielectric layer 482. Nano-crystals 485 are desirably but not essentially of a semiconductor (e.g., Si or SiGe), deposited in such away as to form substantially discrete single crystal islands on first gate dielectric layer 481. However, materials that form amorphous nano-structures can also be used and are intended to be included in the term "nano-crystals." Chemical vapor deposition and ion implantation are preferred methods for forming nano-crystals 485, but any convenient method may be used. In the preferred embodiment, nano-crystals 485 are passivated prior to deposition of second gate oxide layer 482 by exposure to, for example, nitrous or nitric oxide at temperatures preferably greater than 600° C. Second gate dielectric layer 482 is deposited over and covers passivated nano-crystals 485. Chemical vapor deposition (CVD), atomic layer deposition (ALD), and plasma enhanced chemical vapor deposition (PECVD) are non-limiting examples of convenient methods for forming second gate dielectric layer 482. Deposited silicon dioxide formed at temperatures equal or greater than about 700° C. is a preferred material for second gate dielectric layer 482. For convenience of explanation, such oxide is referred to herein as a "high temperature oxide," but this is not intended to be limiting. Second gate dielectric layer 482 is preferably about 50-200 Angstrom units thick, with the upper limit typically determined by the desired programming voltage of the device.

In an alternate method of fabrications of device 40, dielectric layers 481 and 482 are combined, that is, formed as a single dielectric layer of, for example silicon dioxide or other oxides illustrated above or combinations thereof, and nano crystals 485 are then provided by ion implantation. Nano-crystals 485 are formed by implanting silicon or other conductors into combined layers 481,482. The implant energy is chosen so that the atoms are deposited within combined layer 481, 482 at the desired depth, that is, spaced from substrate 41 by region 481 and from conductor 483 by region 482, wherein these regions are about the same thicknesses as previously described. Combined layer 481, 482 formed prior to implantation of the atoms intended to form nano-crystals 485 may be homogeneous, that is, regions 481 and 482 may have the same composition or regions 481 and 482 may have different compositions, depending upon the desired device properties. It is desirable to anneal the implanted structure so that the implanted atoms can agglomerate somewhat thereby forming nano-crystals 485, although this is not essential. Either arrangement described above for providing nano-crystals 485 separated from substrate 41 and gate conductor 483 by dielectric layers or regions 481, 482 is useful.

When a programming voltage of appropriate strength is applied between gate conductor 483 on one side and substrate 41, source 42, or drain 44 on the other side, charge can travel from these electrodes to nano-crystals 485 where the charge is trapped until an opposite programming voltage is applied. The charge can be removed by reversing the programming voltage. The trapped charge effectively biases device 40 into a high or low source-drain conduction state (depending upon the amount and polarity of the stored charge), that persists even after the programming voltage is removed. This provides the desired non-volatile behavior. Depending upon the amount of charge placed on nano-crystals 485, device 40 may be bi-stable, that is, with two stable states, or multi-stable, that is, with more than two stable states.

Device 40 of FIG. 2 differs from prior art device 20 of FIG. 1 by incorporating blocking layer 486 in gate structure or stack 48 (analogous to gate stack 28), located between second gate dielectric layer or region 482 and gate conductor (e.g., poly-Si) layer 483. Blocking layer 486 is desirably of $Al_2O_3$ or TiN, but as is explained below, other materials can also be used. More generally, blocking layer 486 is desirably amorphous so as to avoid crystal boundaries that can provide enhanced diffusion paths, and should be substantially impervious to the impurity being blocked. For example, the poly-Si conveniently but not essentially used for layer 483 often contains excess hydrogen, a byproduct of the poly-Si deposition process. Diffusion of hydrogen into and/or through layers or regions 482 and/or 481 can alter the surface and charge trapping properties of nano-crystals 485, thereby affecting the long term device stability. Thus, blocking layer 486 serves to prevent this unwanted hydrogen diffusion, improving long term device stability. Further, when gate conductor layer 483 consists of a heavily doped semiconductor, such as poly-Si, device performance can be degraded by dopant depletion. However, if a metal or other conductor is used for blocking layer 486, it can act as a gate, eliminating the deleterious dopant depletion effect. In such a case, one skilled in the art will recognize that the composition of blocking layer 486 is desirably chosen, so as to obtain the appropriate work function for the desired device operating conditions. For example using blocking layer 486 consisting of a low work function material such as TiN for N channel devices, and of a high work function material such as MoSiN for P channel devices, can eliminate charge depletion effects in the gate conductor 483.

The material chosen for blocking layer 486 should be substantially impervious to the impurity of interest in the particular device under consideration or react with such impurity(s) so as to bind it and prevent its migration through layer 486 to underlying layers or regions 482, 481 and/or nano-crystals 485. In that regard, it is desirable in some embodiments that layer 486 be amorphous so as to avoid intercrystalline boundaries that might provide enhanced diffusion paths. A further consideration is that blocking layer 486 should not create a significant number of interfacial trap states in contact with second gate dielectric layer 482. It has been found that $Al_2O_3$ and TiN are suitable materials for blocking layer 486. TiN is also desirable because it inhibits dopant depletion from gate conductor 483 when gate conductor 483 is formed of poly-silicon or other doped semiconductor. $Si_3N_4$, while impervious to many impurities, is generally less desirable in the structure of device 40 because of its propensity to form a significant number of interfacial trap states when in contact with second gate oxide dielectric 482. Blocking layer 486 of $Al_2O_3$ or TiN is conveniently formed by CVD, ALD, PECVD, sputtering, or evaporation with thicknesses desirably in the range of about 10 to 500 Angstrom units and more preferably in the range of about 10 to 100 Angstrom units, but other thicknesses may be used in other embodiments. Other potentially useful blocking layer materials are $TiO_2$, $Co_3O_4$, FeBSi, and MoSiN. Any material that does not form significant numbers of interfacial states desirably may be used.

Figure 3:
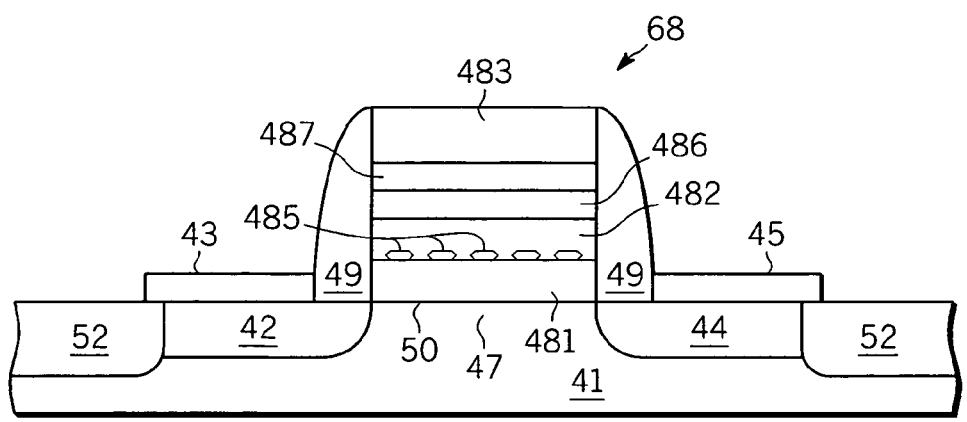
FIG. 3 is a simplified schematic cross-sectional view through a non-volatile memory device, according to a further exemplary embodiment of the present invention.
Figure 4:
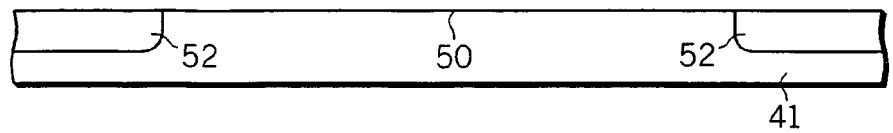
FIG. 4-13 show simplified schematic cross-sectional views illustrating sequential steps in methods of fabricating devices of the types illustrated in FIGS. 2-3, according to still other embodiments of the present invention.

FIG. 3 is a simplified schematic cross-sectional view through non-volatile MOS memory device 60, analogous to that of device 40 of FIG. 2, but according to a further exemplary embodiment of the present invention. Like reference numbers are used to identify like regions and the discussion thereof in connection with device 40 of FIG. 2 is incorporated herein by reference. Devices 40 and 60 differ in that device 40 of FIG. 2 has single blocking layer 486 in gate stack 48 while device 60 of FIG. 3 has double blocking layers 486, 487, located between second gate dielectric layer or region 482 and gate conductor layer 483. Blocking layers 486, 487 are desirably of $Al_2O_3$ or TiN, but as is explained below, other materials can also be used. More generally, one or both of blocking layers 486, 487 are desirably amorphous so as to avoid crystal boundaries that can provide enhanced diffusion paths, and should be substantially impervious to the impurity(s) being blocked. For example, when poly-Si is used for layer 483, it often contains excess hydrogen, a byproduct of the poly-Si deposition process. Diffusion of hydrogen into or through layers or regions 482 and/or 481 can result in changes in the surface and charge trapping properties of nano-crystals 485, thereby affecting the long term device stability. Further, dopant depletion can occur from layer 483, which can also affect the long term device stability. Accordingly, the material chosen for one or the other or both of blocking layers 486, 487 should are desirably substantially impervious to the impurity(s) of interest in the particular device under consideration and/or react with such impurity(s) so as to bind it and prevent its migration through layers 486, 487 to underlying layers 482, 481 and nano-crystals 485. It is also desirable in some embodiments that one or the other or both of layers 486, 487 be amorphous so as to avoid intercrystalline boundaries that might provide enhanced diffusion paths. A further consideration in some embodiments is that blocking layer 486 should not create a significant number of interfacial trap states in contact with second gate dielectric layer 482.

It has been found that $Al_2O_3$ and TiN are suitable materials for blocking layers 486, 487 whereas $Si_3N_4$, while impervious to many impurities, is generally less desirable for layer 486 because of its propensity to form a significant number of interfacial trap states in contact with the oxide that is desirably used for second gate dielectric layer 482. Also, in this configuration, it is preferable to have layer 486 as an amorphous dielectric to inhibit impurity migration, and layer 487 to be metallic or other material suitable for controlling poly-depletion effects and enabling independent work function control. Blocking layers 486, 487 of $Al_2O_3$, TiN or other materials are conveniently formed by CVD, PECVD, ALD, sputtering, or evaporation with thicknesses desirably in the range of about 10 to 500 Angstrom units and more preferably in the range of about 10 to 100 Angstrom units for each of layers 486, 487, but other thicknesses may also be used in various embodiment. In a preferred embodiment, layer 486 is preferably of $Al_2O_3$ and layer 487 is preferably of TiN, although other materials may be substituted for the examples provided. Other potentially useful blocking layer materials are $TiO_2$, $Co_3O_4$, FeBSi, and MoSiN. Additionally, blocking layer 487 can be W, TaC, or other intermetallic compounds that are not necessarily amorphous, as long as blocking layer 486 is effective in inhibiting impurity migration. Materials that do not form significant numbers of harmful interfacial states are desirable. With double blocking layers 486, 487, the number of choices of suitable impurity blocking materials increases. For example, a material that is particularly useful in blocking hydrogen migration can be chosen for one blocking layer, e.g., layer 486 and a different material that is particularly effective in blocking dopant and other impurity migration, and/or for controlling poly-depletion and/or for stabilizing or adjusting work function can be chosen for the other blocking layer, e.g., layer 487, and vice versa. Further, by choosing a material for first blocking layer 486 closest to nano-crystals 485 that does not introduce unwanted interfacial trap states in contact with second gate dielectric layer 482, then greater freedom of choice is available for second blocking layer 487. With such an arrangement, $Si_3N_4$ and similar materials become available for second blocking layer 487 because they are is not in contact with second gate dielectric layer 482, thereby reducing their propensity to form harmful interfacial trap states. One skilled in the art will recognize that if layer 487 is an insulator, such as $Si_3N_4$, then layer 486 should also to be an insulator. It will be appreciated based on the description herein that use of double blocking layers 486, 487 not only further improves device stability but makes available a broader range of material choices so that a structure of optimized properties and stability can be more easily created.

FIGS. 4-13 show simplified schematic cross-sectional views illustrating sequential steps 401-410 (collectively 400) for fabricating devices of the types illustrated, respectively, in FIGS. 2-3, according to still other embodiments of the present invention. FIGS. 4-13 correspond to formation of device 60 shown in FIG. 3, but as is explained, by omitting particular layers included in device 60, device 40 of FIG. 2 is obtained. Process 400 begins in FIG. 4, step 401, with semiconductor substrate 41 having upper surface 50. Isolation regions 52 are conveniently already formed, for example by thermal oxidation of substrate 41 or etch and re-fill or other convenient process, but this is not essential to this invention. Isolation regions 52 may also be formed at later stages of the manufacturing process, depending upon the needs of the user. Persons of skill in the art understand how to form such isolation regions. Substrate 41 is conveniently of single crystal silicon but this is not essential and other semiconductors substrates and SOI substrates may also be used. Substrate 41 may be amorphous, micro-crystalline, single crystal or an SOI structure, depending upon the particular type of device intended to be fabricated. For convenience of description, the rest of process steps 400 are described for the case where substrate 41 is single crystal silicon but this is not intended to be limiting and persons of skill in the art will understand how to modify the particular process steps to take into account use of other semiconductors and/or other forms of semiconductor. In step 402 of FIG. 5, first gate dielectric layer 481 is formed on surface 50 of substrate 41 by any convenient method, preferably thermal oxidation. Thermal oxidation at temperatures in the range of about 700 to 1200° C. is useful, with temperatures in the range of about 800 to 1000° C. being preferred. When layer 481 is being formed of higher dielectric constant materials, such as for example and not intended to be limiting $HfO_2$ or $ZrO_2$, it is desirable to deposit or form such materials at temperatures in the range of 200 to 600° C.

Figure 6:
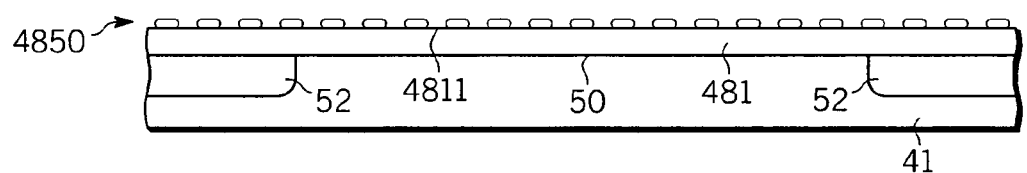

In step 403 of FIG. 6, nano-crystals 4850 are formed on upper surface 4811 of first gate dielectric layer 481. Nano-crystals 4850 can be formed using a variety of techniques well known in the art. Non-limiting examples are aerosol deposition, ion implantation, or preferably by chemical vapor deposition (CVD). In this preferred approach the nano-crystals are directly formed by exposing the gate dielectric upper surface 4811 to a silicon bearing precursor such as silane at temperatures above 400° C. The exposure (deposition) time is used to control the size, spacing, and density of the nano-crystals. In some embodiments it is desirable to maximize the coverage and density of nano-crystals while having a short enough deposition time so that a spacing of about 30 Angstrom units or more is obtained between adjacent nano-crystals. This prevents significant charge percolation between them. After formation of nano-crystals 4850, they are desirably passivated by exposure to nitrous or nitric oxides at temperatures above about 600° C. for a sufficient time to ensure that the outer surfaces of the nano-crystal are completely passivated. Passivation can also be carried out by exposing the nano-crystals to any mild oxidizing ambient, making sure that the nano-crystals are not completely oxidized.

Figure 7:
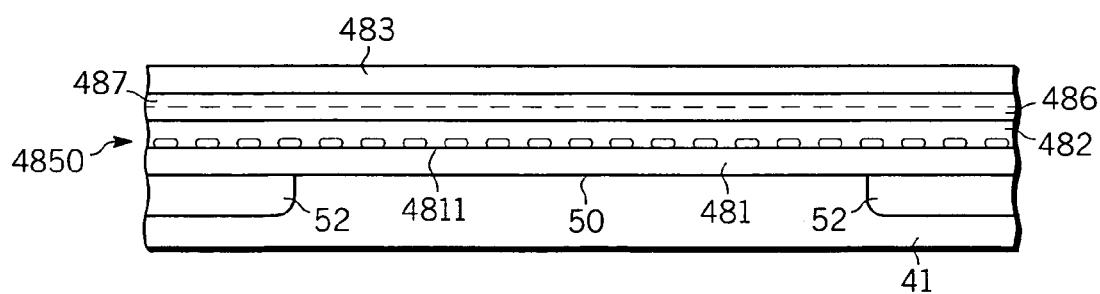

In step 404 of FIG. 7, the structure illustrated in step 403 is covered with the various layers illustrated in devices 40 or 60 of FIGS. 2-3. Referring by way of example, to device 60, second gate dielectric layer 482 is formed over surface 4811 and nano-crystals 4850 on layer 481. Then double blocking layers 486, 487 of for example $Al_2O_3$ and TiN respectively are formed on layer 482. For device 40 of FIG. 2, single blocking layer 486, of for example, $Al_2O_3$ or $TiO_2$, is formed on layer 482. The layers already applied are then covered with gate conductor layer 483, of for example doped poly-silicon, and the structure illustrated in step 404 of FIG. 7 is obtained.

Figure 8:
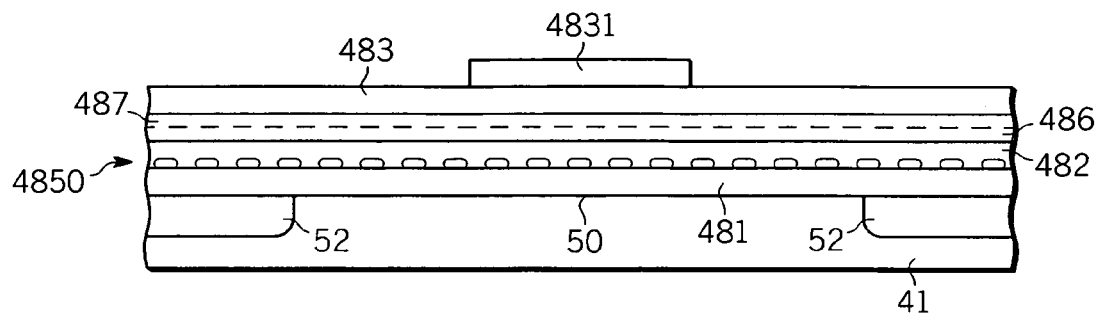
Figure 9:
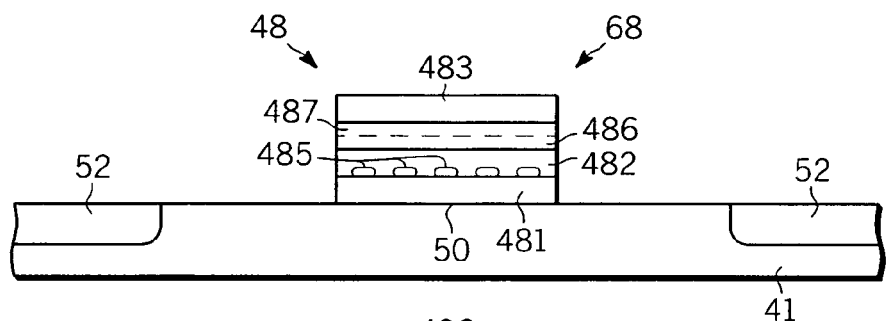

In step 405 of FIG. 8, the structure obtained in step 404 is covered with a masking layer that is patterned to provide mask region 4831 that defines the lateral shape and extent of gate structures or stacks 48, 68. Devices 40 and 60 differ in the layers included in gate stacks 48, 68. The portions of the various layers lying laterally outside of mask region 4831 are then removed to provide gate stacks 48, 68 shown in step 406 of FIG. 9. Chemical or plasma etching is a convenient means of removing the unwanted portions of these various layers, the exact choices of etch conditions and solvents will depend upon the particular materials chosen for gate structures or stacks 48, 68. For a preferred combination of layers corresponding, for example to gate stack 68 wherein layer 483 is poly-Si, layer 487 is TiN, layer 486 is $Al_2O_3$, layer 482 is high temperature deposited oxide and layer 481 is thermal oxide, then a chemical etch is used to remove layer 483, plasma etch is used to remove layer 487, plasma etch is used to remove layer 486, chemical etch is used to remove layer 482 and plasma etch is used to remove the unwanted portions of nano-crystals 4850 leaving behind portion 485 within gate stack 48, 68, and chemical etch is used to remove layer 481, but this is merely by way of example and not intended to be limiting. Other etching procedures and solvents can also be used. After removal of mask region 4831 using means well known in the art, the structure illustrated in step 406 of FIG. 9 is obtained.

Figure 10:
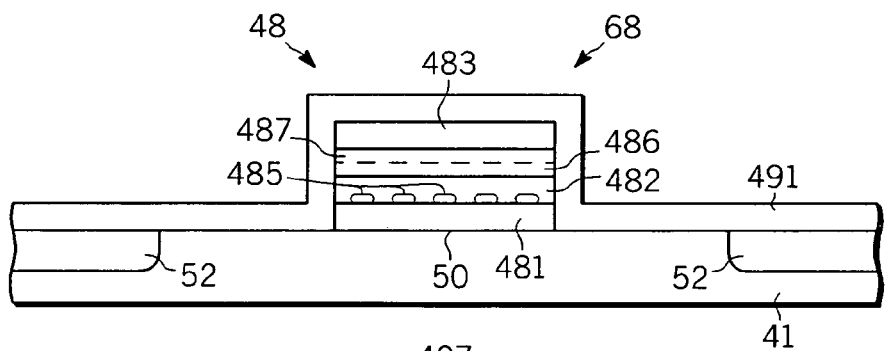
Figure 11:
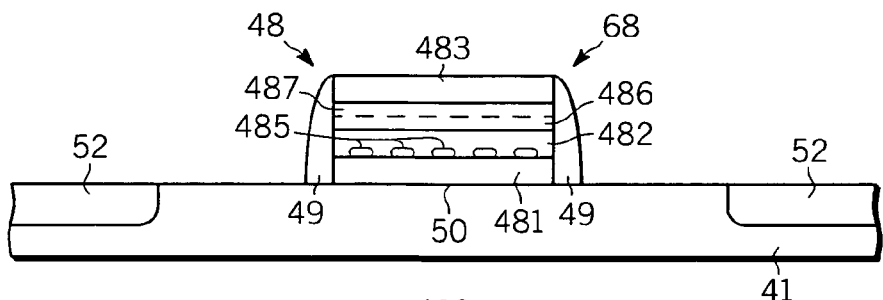
Figure 12:
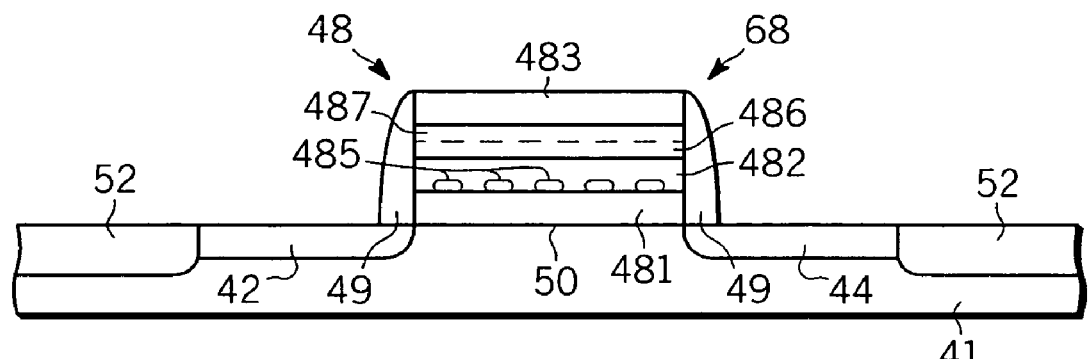
Figure 13:
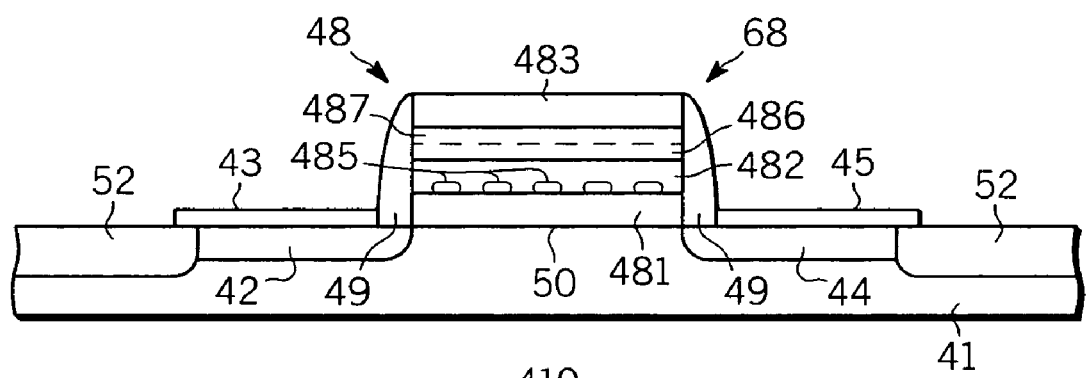

In step 407 of FIG. 10, dielectric layer 491 of, for example silicon nitride ($Si_3N_4$) is deposited substantially conformally over gate structures or stacks 48, 68 and the portions of surface 50 exposed in step 406. The thickness of layer 491 is chosen to correspond approximately to the lateral separation desired between gate structures or stacks 48, 68 and source-drain contacts 43, 45 (e.g., see FIG. 13). Anisotropic etching, well known in the art, is conveniently used to remove those portions of layer 491 that lie substantially parallel to surface 50, leaving behind those portions of layer 491 covering the lateral edges of gate structures or stacks 48, 68, thereby providing lateral separators 49 illustrated in step 408 of FIG. 11. In step 409 of FIG. 12, source drain-regions 42, 44 are formed. Ion implantation followed by a thermal drive is a convenient means of providing source-drain regions 42, 44, but any convenient doping means may be used. In step 410 of FIG. 13, metal contacts 43, 45 are provided using techniques well known in the art. NiSi, PtSi, or CoSi are preferred for contacts 43, 45. Metal contacts may also be applied to gate conductor layer 483 either in the vicinity of or remotely from devices 40, 60, but this is not essential. With both layers 486, 487 included, the structure shown in step 410 (FIG. 13) corresponds to device 60 of FIG. 3. With only layer 486 included, the result corresponds to device 40 of FIG. 2.

Figure 14:
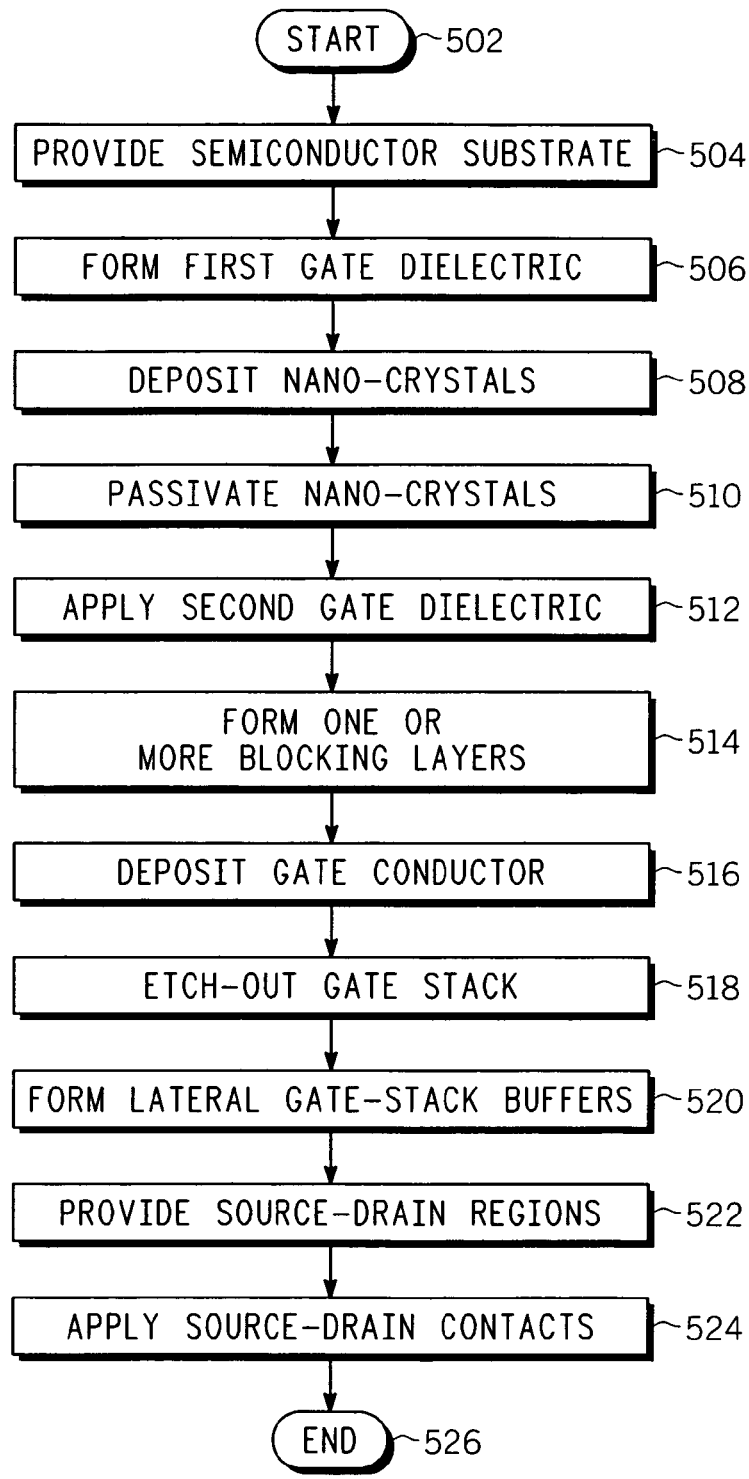
FIG. 14 shows a simplified flow chart illustrating the method of the present invention for forming a non-volatile device, according to a yet further embodiment of the present invention.

FIG. 14 shows a simplified flow chart illustrating method 500 of the present invention for forming a non-volatile MOS device with a nano-crystal gate structure, according to a further embodiment of the present invention. Method 500 begins with START 502 and initial step 504 wherein substrate 41 is provided. As previously noted, substrate 41 may be single or polycrystalline and homogeneous or layered or an SOI structure. Isolation regions 52 are conveniently but not essentially formed in substrate 41 prior to this stage using techniques well known in the art. However, isolation regions 52 may also be formed later in the process. Either arrangement is useful. In step 506, first gate dielectric 481 is formed, for example, by thermal oxidation of substrate 41 to provide a dielectric layer (e.g., $SiO_2$) with thickness usefully in the range of about 10 to 100 Angstrom units, and preferably about 20 to 80 Angstrom units. It is recognized, however, that first gate dielectric layer 481 can be, for example, a metal oxide with physical thickness increased by the ratio of the metal oxide dielectric constant and the $SiO_2$ dielectric constant, compared to the desired thickness range for $SiO_2$. In step 508 nano-crystals 4850 are formed on first gate dielectric layer 481, for example, by chemical vapor deposition. A convenient method for forming such nano-crystals is described for example in commonly owned U.S. Pat. No. 6,784,103 but other methods may also be used. Optional step 510 is desirable to passivate nano-crystals 485 by exposing them to nitrous or nitric oxide. However, this is merely by way of example and not intended to be limiting, and other passivation treatments can also be used, such as for example and not intended to be limiting, exposure to a dilute oxygen ambient. In subsequent step 512, second gate dielectric layer 482 is deposited over nano-crystals 4850 and first gate dielectric layer 481. In step 514, one or more blocking layers 486, 487 using materials and thicknesses already described are deposited over second gate dielectric layer 482. In step 516 gate conductor layer 483, of for example doped poly-silicon, is provided over the one or more blocking layers 486, 487. In step 518 mask region 4381 is provided and gate structures or stacks 48, 68 are etched out. In step 520, conformal layer 491 is deposited over gate stacks 48, 68 and surrounding regions and anisotropic etching conveniently used to form lateral gate stack buffer regions 49. In step 522 source-drain regions 42, 44 are provided by any convenient doping means. Other than contacts 43, 45, devices 40, 60 are substantially finished at this stage of the process. In step 524, source-drain (S-D) contacts 43, 45 are conveniently provided. A metal contact region (not shown) may also optionally be provided in contact with gate conductor layer 483, but this is not essential. Method 500 then conveniently terminates at END 526.

Figure 5:
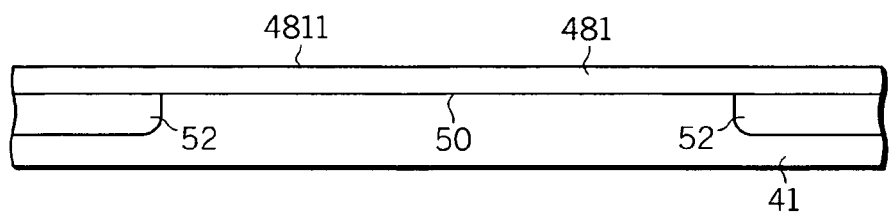

FIGS. 15-18 in combination with FIGS. 4-13 show simplified schematic cross-sectional views illustrating sequential steps 401, 402-1 - 404-1 and 405 through 410 for fabricating devices of the types illustrated in FIGS. 2-3, according to still further embodiments of the present invention. The sequential steps illustrated in FIGS. 4-13 and illustrated in FIGS. 15-18 differ only in the manner of formation of nano-crystal layer 4850 and nano-crystals 485. Accordingly the discussion of FIGS. 4-13 is incorporated herein by reference and only those steps which differ are described in connection with FIGS. 15-18. The methods of FIGS. 4-13 and 15-18 both begin with step 401 of FIG. 4. Following step 401 of FIG. 4, in step 402-1 of FIG. 18, composite gate dielectric layer 4812 is formed on surface 50 of substrate 41. Composite layer 4812 comprises lower region 481 in contract with surface 50 of substrate 41 and upper region 482 overlying lower region 481. Layer 4812 of regions 481, 482 is formed by any convenient dielectric formation techniques, such as those that have already been described for layers 481, 482 in connection with FIGS. 2-3 and 5-13. Layer 4812 may be homogeneous, that is, having a uniform composition as a function of distance from surface 50 or the composition may vary, depending upon the desired device properties. Regions 481, 482 of layer 4812 are analogous in function and can be analogous in composition to layers 481, 482 described in connection with FIGS. 2-3 and 5-13. For convenience of explanation, in FIG. 15 location 4811' analogous to interface 4811 of FIGS. 5-7 is identified. Location 4811' indicates the approximate depth within composite dielectric layer 4812 where nano-crystals 485 are intended to be located. It may or may not indicate a compositional interface depending upon whether the composition of layer 4812 varies as a function of distance from surface 50.

Referring now to step 403-1 of FIG. 16, ions 4850' of the conductor (e.g., Si) desired to form nano-crystals 485 are implanted into composite layer 4812 as indicated by arrows 4849. The implant energy is chosen so as to deposit the implanted ions substantially at location 4811'. In the case where composite layer 4812 is $SiO_2$, of about 50-200 Angstrom units thickness, an implant energy in the range of about 1 to 10 keV and dose in the range of about 1 to 5E16 ions per square cm is useful, with energy of about 1 keV and dose in the range of about 2E16 ions per square cm being preferred. Persons of skill in the art will understand how to adjust the implant energy and dose for different composition and thicknesses of layer 4812 so as to have region 481 between the layer of implanted ions at location 4811' and surface 50 and region 482 above the layer of implanted ions at location 4811'. In step 403-2 of FIG. 17, the structure of FIG. 16 is annealed to promote some agglomeration of the implanted ions to form spaced-apart nano-crystals 4850 at location 4811'. Temperature in the range of about 800 to 1000° C. in a dilute oxygen atmosphere for about 10 to 100 minutes is suitable, although longer and shorter anneals can be used at the same or different temperatures and atmospheres, depending on the particular combination of dielectric materials and implant ions being used. Persons of skill in the art will understand how to make such adjustments based on their choices of materials. In step 404-1 of FIG. 18, overlying layers 486, 487, 483 are formed on the structure of FIG. 17, in the same manner and for the same purpose as explained in conjunction with step 404 of FIG. 7. Steps 405-410 are then carried out as described in connection with FIGS. 8-13, and the discussion thereof is incorporated herein by reference. The structures shown in FIGS. 2-3 result, depending upon whether one or both of blocking layers 486, 487 are provided, as has already been explained.

Figure 19:
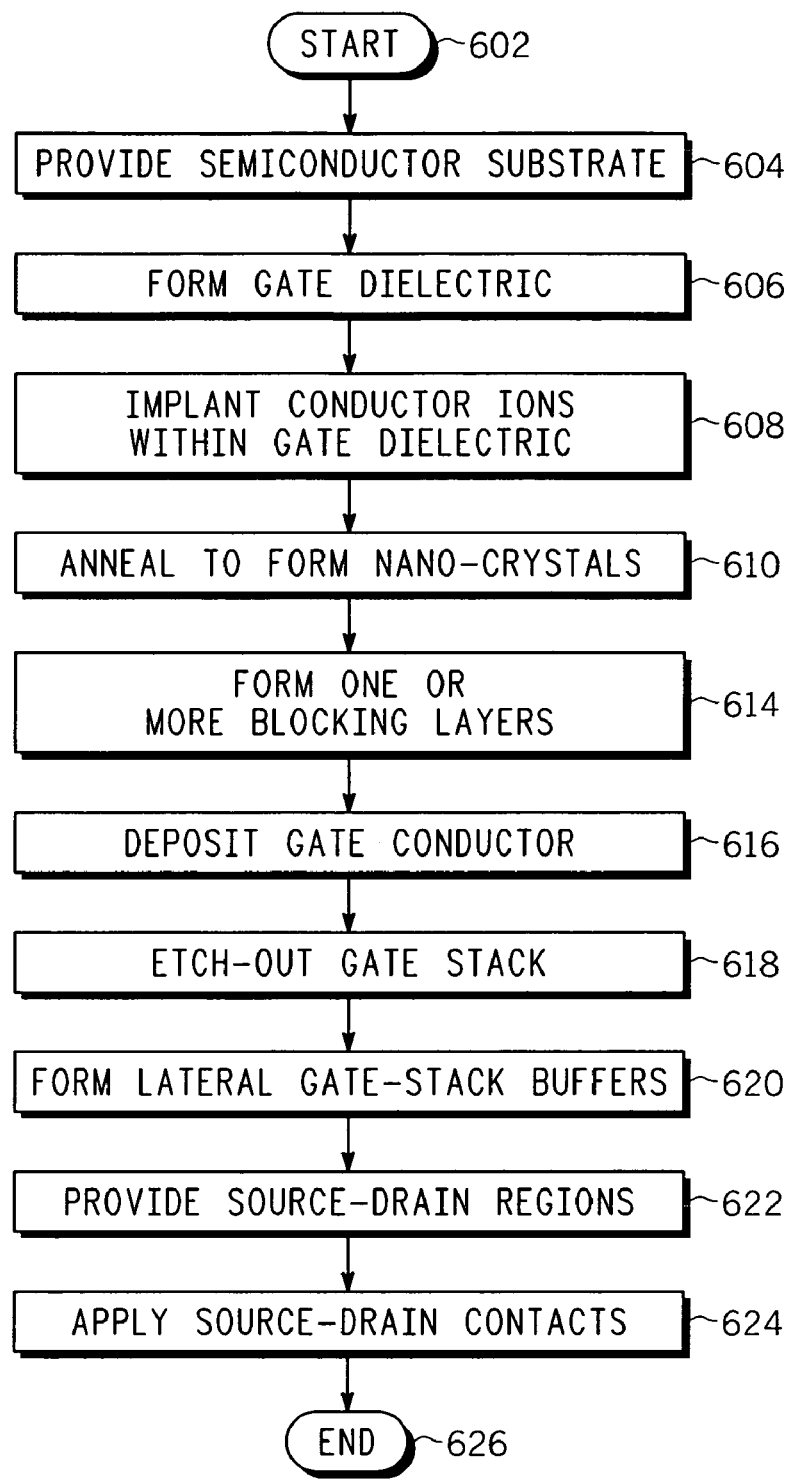
FIG. 19 shows a simplified flow chart analogous to FIG. 14 illustrating the method of the present invention for forming a non-volatile device, according to a still yet further embodiment of the present invention.

FIG. 19 shows a simplified flow chart analogous to FIG. 14 illustrating method 600 of the present invention for forming a non-volatile semiconductor device, according to a still yet further embodiment of the present invention. Method 600 of FIG. 19 and method 500 of FIG. 14 differ in the manner of formation of nano-crystals 485. Steps 604 and 614-624 are analogous to steps 504 and 514-524 of method 500 of FIG. 14 and the discussion thereof is incorporated herein by reference. In step 606 of method 600, composite gate dielectric 4812 is formed as described in connection with step 402-1 of FIG. 15. In step 608, ions intended to form nano-crystals 4850, 485 are implanted within composite gate dielectric 4812 as described in connection with step 403-1 of FIG. 16. While silicon is a particularly useful material for nano-crystals 4850, 485 and is preferred, other materials can also be used. In step 610, the structure illustrated in FIG. 16 is annealed as described in connection with step 403-2 of FIG. 17 to form nano-crystals 4850 within composite dielectric layer 4812. In step 614, layers 486, 487, 483 are formed on the structure of FIG. 17 to yield the structure illustrated in FIGS. 18 and 7. The remainder of steps 616-624 of method 600 are the same as analogous steps 516-524 of method 500, the description of which is incorporated herein by reference.

According to a first exemplary embodiment, there is provided a semiconductor device, comprising, a semiconductor substrate having a principal surface, spaced-apart source and drain regions separated by a channel region at the principal surface, a multilayered gate structure located over the channel region, wherein the multilayered gate structure comprises, a first gate dielectric region, a second gate dielectric region overlying the first gate dielectric region and having an interface with the first gate dielectric region, nano-crystals of a conductive material disposed at the interface between the first and second gate dielectric regions, one or more impurity blocking layers disposed over the second gate dielectric region, and at least a first conductor disposed on the one or more impurity blocking layers. According to a further exemplary embodiment, the one or more of the impurity blocking layers comprise $Al_2O_3$, TiN, $TiO_2$, $Co_3O_4$, FeBSi, MoSiN, or $Si_3N_4$. According to a still further exemplary embodiment, the one or more impurity blocking layers comprise a first blocking layer closest to the substrate and a second blocking layer closest to the first conductor, and wherein the second blocking layer comprises an electrically conductive compound and the first blocking layer comprises a dielectric compound. According to a yet further exemplary embodiment, the one or more impurity blocking layers comprise a first blocking layer comprising aluminum or titanium oxide or combinations thereof and a second blocking layer comprising silicon or titanium nitride or combinations thereof. According to another embodiment, the first gate dielectric region comprises a metal oxide. According to a yet another embodiment, the metal oxide comprises oxides of hafnium or zirconium or combinations thereof. According to a still another embodiment, at least one of the one or more impurity blocking layers has a thickness in the range of about 10 to 500 Angstrom units.

According to a second exemplary embodiment, there is provided a semiconductor device, comprising, a substrate having therein a source region and a drain region separated by a channel region extending to a first surface of the substrate, a multilayered gate structure located above the channel region, wherein the gate structure comprises, a first dielectric in substantial contact with the channel region, a second dielectric of composition substantially the same or different than the first dielectric disposed on the first gate dielectric, spaced-apart nano-crystals located substantially where the first dielectric and the second dielectric join and covered by the second dielectric, a gate conductor above the second dielectric, wherein the gate conductor is a source of a mobile impurity, and at least one blocking layer disposed between the second dielectric and the gate conductor, and adapted to inhibit motion of the mobile impurity into the second dielectric. According to a further embodiment, the at least one blocking layer comprises TiN or $Al_2O_3$ or combinations thereof. According to a still further embodiment, the device further comprises at least two blocking layers, wherein a first blocking layer in contact with the second dielectric comprises an insulating layer and a second blocking layer in contact with the gate conductor comprises an insulating layer or a conductive layer. According to a yet still further embodiment, the device further comprises at least two blocking layers, wherein a first blocking layer in contact with the second dielectric comprises $Al_2O_3$ and a second blocking layer comprises silicon nitride or titanium nitride. According to a still yet further embodiment, the nano-crystals are, on average, spaced apart by about 30 Angstrom units or more. According to another embodiment, at least one of the blocking layers is amorphous. According to a yet another embodiment, the device further comprises at least two blocking layers, wherein a first blocking layer in contact with the second dielectric comprises a layer for inhibiting motion of the mobile impurity into the second dielectric and a second blocking layer in contact with the gate conductor comprises a material for modifying the work function of the gate conductor presented to the channel region. According to a still another embodiment, the device further comprises at least two blocking layers, wherein a first blocking layer in contact with the second dielectric comprises a layer for inhibiting motion of the mobile impurity into the second dielectric and a second blocking layer in contact with the gate conductor comprises a material for modifying the threshold voltage of the device compared to its threshold voltage without the second blocking layer.

According to a third exemplary embodiment, there is provided a method for forming a semiconductor device with a nano-crystal gate structure resistant to migration of a mobile species, comprising, providing a semiconductor substrate having an upper surface, creating on the upper surface a gate dielectric having therein a layer of spaced-apart nano-crystals of a material adapted to reversibly receive and store charge, forming one or more impurity blocking layers over the gate dielectric, forming a gate conductor layer over the one or more impurity blocking layers, etching out a gate stack comprising portions of the gate dielectric, the nano-crystals, the one or more impurity blocking layers and the gate conductor layer, and providing spaced-apart source-drain regions laterally disposed on either side of the gate stack. According to a further embodiment, the creating step comprises forming a first gate dielectric region on the upper surface, depositing the layer of nano-crystals on the first gate dielectric region, and forming a second gate dielectric region over the nano-crystals and the first gate dielectric region wherein the first and second gate dielectric regions form the gate dielectric. According to a still further embodiment, the method comprises prior to forming the second gate dielectric, passivating the nano-crystals. According to a yet further embodiment, the creating step comprises forming the gate dielectric on the upper surface, implanting into the gate dielectric ions of the material adapted to reversibly receive and store charge, and annealing the implanted ions to form the layer of spaced-apart nano-crystals in the gate dielectric. According to a yet still further embodiment, the step of forming the one or more impurity blocking layers over the gate dielectric, comprises, forming a first impurity blocking layer of $Al_2O_3$, $TiO_2$, or $Co_3O_4$, or combinations thereof in contact with the gate dielectric, and then forming a second impurity blocking layer of $Si_3N_4$, TiN, FeBSi, MoSiN or combinations thereof over the first blocking layer. According to a still yet further embodiment, the step of forming the one or more impurity blocking layers comprises forming at least one of the one or more impurity blocking layers of an amorphous material.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for forming a semiconductor device with a nano-crystal gate structure resistant to migration of a mobile species, comprising:

providing a semiconductor substrate having an upper surface;

creating on the upper surface a gate dielectric having therein a layer of spaced-apart nano-crystals of a material adapted to reversibly receive and store charge;

forming first and second impurity blocking layers over the gate dielectric by forming the first impurity blocking layer in contact with the gate dielectric, wherein the first impurity blocking layer comprises FeBSi, and forming the second impurity blocking layer in contact with the first impurity blocking layer, wherein the second impurity blocking layer comprises a second material selected from a second group that includes $Al_2O_3$, TiN, TiO2, Co3O4, FeBSi, MoSiN, W, TaC, and Si3N4;

forming a gate conductor layer over the first and second impurity blocking layers;

etching out a gate stack comprising portions of the gate dielectric, the nano-crystals, the first and second impurity blocking layers and the gate conductor layer; and providing spaced-apart source-drain regions laterally disposed on either side of the gate stack.

2. The method of claim 1, wherein the creating step comprises:

forming a first gate dielectric region on the upper surface;

depositing the layer of nano-crystals on the first gate dielectric region; and forming a second gate dielectric region over the nano-crystals and the first gate dielectric region, wherein the first and second gate dielectrics regions form the gate dielectric.

3. The method of claim 2, further comprising, prior to forming the second gate dielectric region, passivating the nano-crystals.

4. The method of claim 1, wherein the creating step comprises:

forming the gate dielectric on the upper surface;

implanting into the gate dielectric ions of the material adapted to reversibly receive and store charge; and annealing the implanted ions to form the layer of spaced-apart nano-crystals in the gate dielectric.

5. A method for forming a semiconductor device with a nano-crystal gate structure resistant to migration of a mobile species, comprising:

providing a semiconductor substrate having an upper surface;

creating on the upper surface a gate dielectric having therein a layer of spaced-apart nano-crystals of a material adapted to reversibly receive and store charge;

forming a first impurity blocking layer in contact with the gate dielectric, wherein the first impurity blocking layer comprises FeBSi;

forming a second impurity blocking layer in contact with the first impurity blocking layer, wherein the second impurity blocking layer comprises a different material from a material used in the first impurity blocking layer;

forming a gate conductor layer over the second impurity blocking layer;

etching out a gate stack comprising portions of the gate dielectric, the nano-crystals, the first and second impurity blocking layers and the gate conductor layer; and providing spaced-apart source-drain regions laterally disposed on either side of the gate stack.

6. The method of claim 5, wherein forming the second impurity blocking layer comprises forming the second impurity blocking layer using a material selected from a group of materials that consists of $Al_2O_3$, TiN, $TiO_2$, $Co_3O_4$, MoSiN, W, TaC, and $Si_3N_4$.

7. The method of claim 5, wherein forming the second impurity blocking layer comprises forming the second impurity blocking layer using TiN.

8. The method of claim 5, wherein forming the second impurity blocking layer comprises forming the second impurity blocking layer using $Si_3N_4$.

9. The method of claim 5, wherein the nano-crystals are, on average, spaced apart by about 30 Angstrom units or more.

10. The method of claim 5, wherein the creating step comprises:
   forming a first gate dielectric region on the upper surface;
   depositing the layer of nano-crystals on the first gate dielectric region; and
   forming a second gate dielectric region over the nano-crystals and the first gate dielectric region, wherein the first and second gate dielectrics regions form the gate dielectric.

11. The method of claim 1, wherein at least one of the first and second impurity blocking layers has a thickness in the range of about 10 to 500 Angstrom units.

12. A method for forming a semiconductor device with a nano-crystal gate structure resistant to migration of a mobile species, comprising:
   providing a semiconductor substrate having an upper surface;
   creating on the upper surface a gate dielectric having therein a first gate dielectric region on the upper surface, a layer of spaced-apart nano-crystals of a material adapted to reversibly receive and store charge on the first gate dielectric region, and a second gate dielectric region over the nano-crystals and the first gate dielectric region;
   forming a first impurity blocking layer in contact with the gate dielectric, wherein the first impurity blocking layer comprises FeBSi;
   forming a second impurity blocking layer in contact with the first impurity blocking layer, wherein the second impurity blocking layer comprises a different material from a material used in the first impurity blocking layer;
   forming a gate conductor layer over the second impurity blocking layer;
   etching out a gate stack comprising portions of the gate dielectric, the nano-crystals, the first impurity blocking layer, the second impurity blocking layer, and the gate conductor layer; and
   providing spaced-apart source-drain regions laterally disposed on either side of the gate stack.

13. The method of claim 12, wherein the creating step comprises:
   forming the first gate dielectric region on the upper surface;
   depositing the layer of nano-crystals on the first gate dielectric region; and
   forming the second gate dielectric region over the nano-crystals and the first gate dielectric region, wherein the first and second gate dielectrics regions form the gate dielectric.

14. The method of claim 12, wherein the creating step comprises:
   forming the gate dielectric on the upper surface;
   implanting into the gate dielectric ions of the material adapted to reversibly receive and store charge; and
   annealing the implanted ions to form the layer of spaced-apart nano-crystals in the gate dielectric.

15. The method of claim 12, wherein the second impurity blocking layer includes a material selected from a group of materials that consists of $Al_2O_3$, TiN, $TiO_2$, $Co_3O_4$, MoSiN, W, TaC, and $Si_3N_4$.

* * * * *